*(12)* United States Patent
Iimori et al.

(10) Patent No.: US 7,581,448 B2
(45) Date of Patent: Sep. 1, 2009

(54) SENSOR AND MANUFACTURING METHOD OF SENSOR

(75) Inventors: Yukinobu Iimori, Tokyo (JP); Nobuaki Yamada, Tokyo (JP); Shuji Tohyama, Tokyo (JP); Takayuki Yokoyama, Tokyo (JP)

(73) Assignee: Nagano Keiki Co., Ltd., Tokyo (JP)

( * ) Notice: Subject to any disclaimer, the term of this patent is extended or adjusted under 35 U.S.C. 154(b) by 0 days.

(21) Appl. No.: 12/047,513

(22) Filed: Mar. 13, 2008

(65) Prior Publication Data

US 2008/0223142 A1 Sep. 18, 2008

(30) Foreign Application Priority Data

Mar. 14, 2007 (JP) ............................. 2007-065164

(51) Int. Cl.
*G01L 7/00* (2006.01)
(52) U.S. Cl. .......................................... 73/714; 73/715

(58) Field of Classification Search .................. 73/714, 73/715
See application file for complete search history.

(56) References Cited

FOREIGN PATENT DOCUMENTS

| JP | 2005-326337 | 11/2005 |
|---|---|---|
| JP | 2006-38824 | 2/2006 |

*Primary Examiner*—Andre J Allen
(74) *Attorney, Agent, or Firm*—Rankin, Hill & Clark LLP

(57) ABSTRACT

A pressure sensor is provided with a cap on a measuring portion of a diaphragm to which a first end of a flexible board is connected while a second end of the flexible board is connected to a circuit board spaced apart from the diaphragm. The flexible board is provided with the first end, a belt portion that is bent at an angle of ninety degrees or more relative to the first end in a direction to be away from the circuit board and is curved along the outer circumference of the diaphragm, and the second end that is bent at an angle of ninety degrees or more relative to the belt portion to be connected to the circuit board.

7 Claims, 7 Drawing Sheets

SENSOR AND MANUFACTURING METHOD OF SENSOR

The priority application Number JP 2007-0665164 upon which this patent application is based is hereby incorporated by reference.

BACKGROUND OF THE INVENTION

1. Field of the Invention

The present invention relates to a sensor having a sensor element and a flexible board with an end connected to a measuring portion of the sensor element, and a manufacturing method of sensor.

2. Description of Related Art

A pressure sensor for measuring fluid pressure has been known as one of those sensors that measure physical quantities.

A conventional example of such a pressure sensor includes: a pressure-sensitive element attached to an end of a pipe; a circuit board; and a flexible board having an end connected to the pressure-sensitive element and the other end connected to the circuit board (document: JP-A-2005-326337).

The flexible board is employed for transmitting a signal of the pressure-sensitive element to the circuit board. In the conventional example disclosed in the above document, the flexible board is bent for accommodating within the pipe.

Since the flexible board of the conventional example disclosed in the above-mentioned document is bent for accommodating within the pipe, copper pattern provided on the flexible board may be cracked or otherwise damaged when the flexible board is bent for accommodating within the pipe. In order not to cause cracks and the like on the copper pattern, the bending angle of the flexible print board has to be increased, which requires a large accommodation space for the flexible board.

SUMMARY OF THE INVENTION

An object of the invention is to provide a sensor that does not cause damage on a flexible board when the flexible board is bent to be accommodated and is capable of accommodating the flexible board with a compact space, and a manufacturing method of the sensor.

A sensor according to an aspect of the invention includes: a sensor element having a measuring portion; a cap provided on the measuring portion of the sensor element; and a flexible board, in which the flexible board has a first end connected to a flat side of the cap, a belt portion that is bent away from a circuit board spaced apart from the sensor element at an angle of ninety degrees or more relative to the first end and is curved along an outer circumference of the sensor element, and a second end that is bent at an angle of ninety degrees or more relative to the belt portion to be connected with the circuit board.

According to the above aspect of the invention, since it is only necessary that the first end and the second end are bent at an angle of ninety degrees or more relative to the belt portion, the flexible board is not locally bent by an acute angle. Accordingly, no crack is generated on the electro-conductive portion provided on the flexible board, e.g. wiring pattern. In addition, since the flexible board is bent along the outer circumference of the sensor element, the flexible board is bent by a minimum required angle within a narrow space, thus reducing the accommodation space of the flexible board.

In the above aspect of the invention, it is preferable that a periphery of the belt portion does not protrude from the flat side of the cap.

According to the above arrangement, since the belt portion does not protrude from the flat side of the cap, the belt portion does not impede bonding process of the second end to the circuit board. Accordingly, the bonding process of the flexible board can be easily conducted.

Further, in the above aspect of the invention, it is preferable that the sensor element is bonded to a joint, a block having an inner circumference spaced away from the outer circumference of the sensor element by a predetermined gap is bonded to the joint and the circuit board is attached to the block.

According to the above arrangement, since the sensor element attached with the flexible board is housed within the interior space of the block, space reduction can be further enhanced.

In the above aspect of the invention, it is preferable that a bonding pad that constitutes a part of a first wiring pattern is provided on the first end of the flexible board at a side remote from the cap, and a support pad having the same shape as the bonding pad is provided on the first end of the flexible board on a side facing the cap at a position corresponding to the bonding pad.

According to the above arrangement, even when a force toward the cap is applied in compression-bonding the first end of the flexible board to the cap, the support pad having the same shape as the bonding pad is provided on an opposite side of the flexible board sandwiching the first end, so that the first end of the flexible board is not tilted or deformed, thus securing flatness of the first end of the flexible board.

Accordingly, since the flatness of the bonding pad itself can be secured, the wire-bonding between the bonding pad and the sensor element can be securely conducted, thus further enhancing the bonding strength therebetween.

In the above aspect of the invention, it is preferable that a planar area of the support pad is larger than a planar area of the bonding pad.

According to the above aspect of the invention, since the flatness of the bonding pad is secured even when the positional relationship between the bonding pad and the support pad is somewhat out of alignment, the flexible board can be easily manufactured.

In the above aspect of the invention, it is preferable that a second wiring pattern is provided on a side of the flexible board facing the cap, and a part of the second wiring pattern is constituted by the support pad.

According to the above arrangement, with the use of the support pad as a part of the wiring pattern provided in advance, the support pad can be formed simultaneously with the formation of the wiring pattern.

Accordingly, the flexible board can be easily manufactured.

A method according to another aspect of the invention is for manufacturing the sensor, the method including: attaching the cap on the sensor element; connecting the first end of the flexible board to the cap; bending the belt portion by an angle of ninety degrees or more relative to the first end to be curved along the outer circumference of the sensor element; and bonding the second end to the circuit board.

According to the above aspect of the invention, the manufacturing method for a sensor that can exhibit the same advantages as in the above can be provided.

DETAILED DESCRIPTION OF PREFERRED EMBODIMENT(S)

An exemplary embodiment of the invention will be described below with reference to attached drawings.

Figure 1:
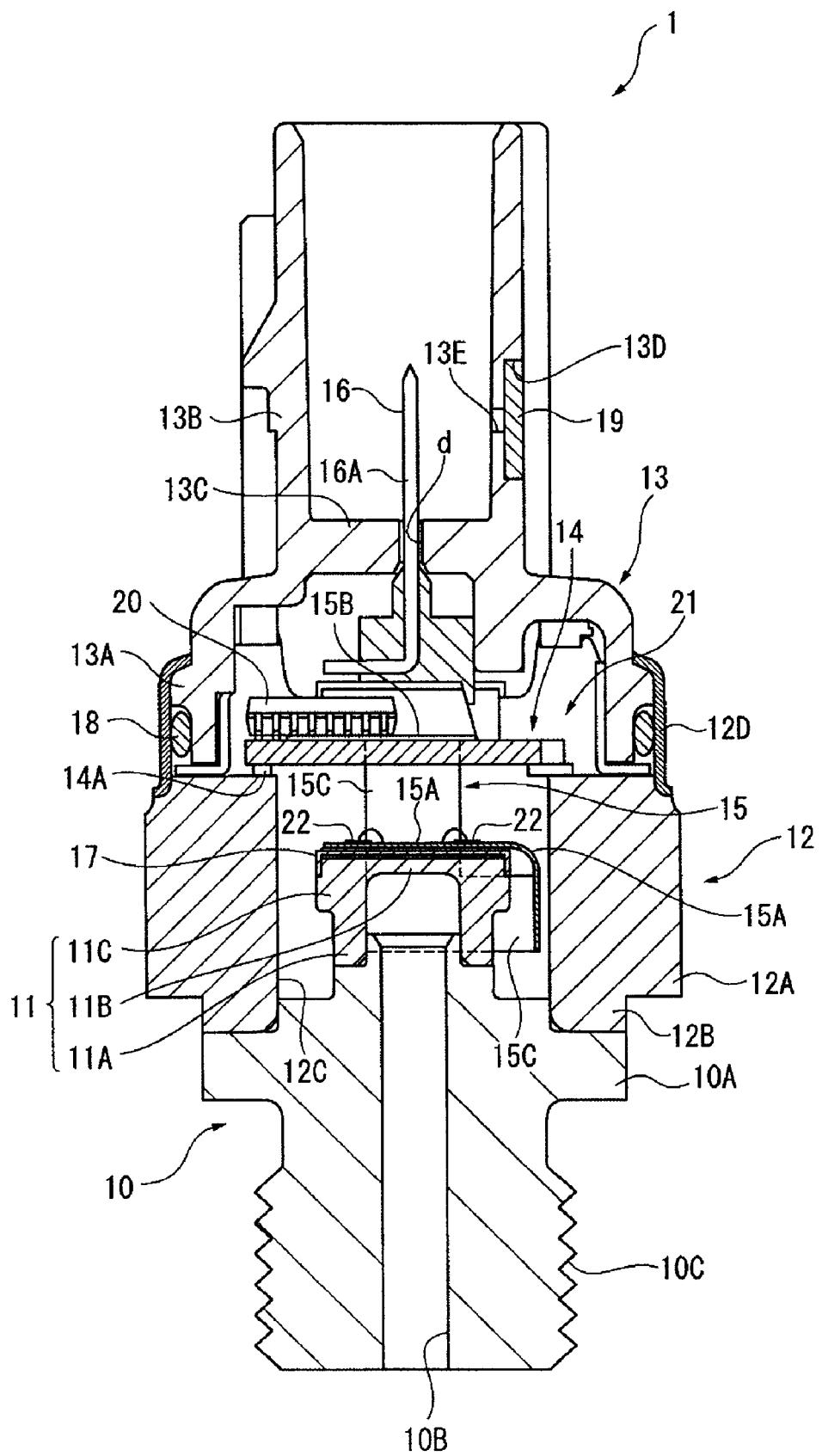
FIG. 1 is a cross section of a pressure sensor 1 of the exemplary embodiment.

FIG. 1 is a cross section of a pressure sensor of the exemplary embodiment.

As shown in FIG. 1, the pressure sensor 1 is provided with: a joint 10 having a flange 10A at an intermediate position thereof; a diaphragm 11 (sensor element) provided on a first end of the joint 10; a block 12 provided on the flange 10A of the joint 10; a housing 13 and a circuit board 14 respectively provided on the block 12; a flexible board 15 connected to the housing 13 and the diaphragm 11; and a terminal 16 supported by the housing 13.

The joint 10 is a molded metal component and is provided with a pressure port 10B extending from the first end to a second end opposite thereto.

A screw 10C to be screwed into a pipe in which to-be-measured fluid is flowed (not shown) is provided on an outer circumference of the joint 10 on a side adjacent to the second end relative to the flange 10A.

The diaphragm 11 is provided by a metal component, which includes: a cylindrical member 11A; a disk 11B provided on a first end of the cylindrical member 11A; and a flange 11C provided on an outer circumference of the cylindrical member 11A, the cylindrical member 11A, the disk 11B and the flange 11C being provided in an integrated manner. The to-be-measured fluid is introduced into a recessed space provided inside the cylindrical member 11A and the disk 11B of the diaphragm 11 through the pressure port 10B of the joint 10.

A measuring portion that detects the pressure by a strain gauge and the like is provided on a side of the disk 11B of the diaphragm 11 opposite to a side on which the to-be-measured fluid is introduced. A cap 17 is provided to cover an upper side of the measuring portion. The cap 17 is bonded to be electrically coupled with a first end of the flexible board 15.

The block 12 is a metal component, which includes an integrated component of a hexagonal portion 12A with a hexagonal outer circumference and a circular portion 12B with a circular outer circumference. A cylindrical space 12C for the diaphragm 11 to be disposed penetrates through the inside of the block 12.

An end of the block 12 on the side of the circular portion 12B is welded to the flange 10A of the joint 10.

A substantially cylindrical exterior portion 12D is provided on an end of the block 12 on the side of the hexagonal portion 12A. The exterior portion 12D is provided for crimping the housing 13. An end of the exterior portion 12D is bent toward the axial center of the joint 10 after the housing 13 is attached.

The housing 13 is a synthetic resin component, which has a substantially bottomed-cylindrical base end 13A and a cylindrical distal end 13B integrated with the base end 13A.

A periphery of the base end 13A is fitted to the exterior portion 12D of the block 12. An O ring 18 is provided between the inner circumference of the exterior portion 12D and the outer circumference of the base end 13A.

The terminal 16 is held by a disk 13C provided between the base end 13A and the distal end 13B. A gap d is provided between the terminal 16 and the disk 13C. The gap d is for adjusting the variable pressure within the space surrounded by the joint 10, the diaphragm 11, the block 12 and the housing 13.

The distal end 13B is adapted to be connected with a connector (not shown). An air-vent filter 19 that allows circulation of exterior air is provided on the distal end 13B at a position covered by the connector.

The air-vent filter 19 satisfies both requirements of waterproof property and air permeability, which is substantially formed in a disk-shape. A recess 13D for the air-vent filter 19 to be fitted is provided on the outer circumference of the distal end 13B. An air-vent 13E is connected to the recess 13D.

The circuit board 14 is sized so as to cover the opening of the cylindrical space 12C of the block 12, both ends of which are supported on an end surface of the block 12 with an attachment 14A. Electronic components 20 are mounted on the circuit board 14.

The terminal 16 is bent substantially in an L-shape. A first end 16A of the terminal 16 is supported by the housing 13 while a second end thereof is electrically coupled with the circuit board 14.

The bent portion of the terminal 16 is fixed on a case 21 that is attached to the end surface of the block 12.

The flexible board 15 includes a first end 15A of which whole area is connected to the cap 17, a second end 15B connected to the circuit board 14 and a belt portion 15C that connects the first end 15A and the second end 15B. The first end 15A is electrically coupled with the diaphragm 11 by a bonding wire. The second end 15B is electrically coupled to the circuit board 14 by soldering.

Figure 2:
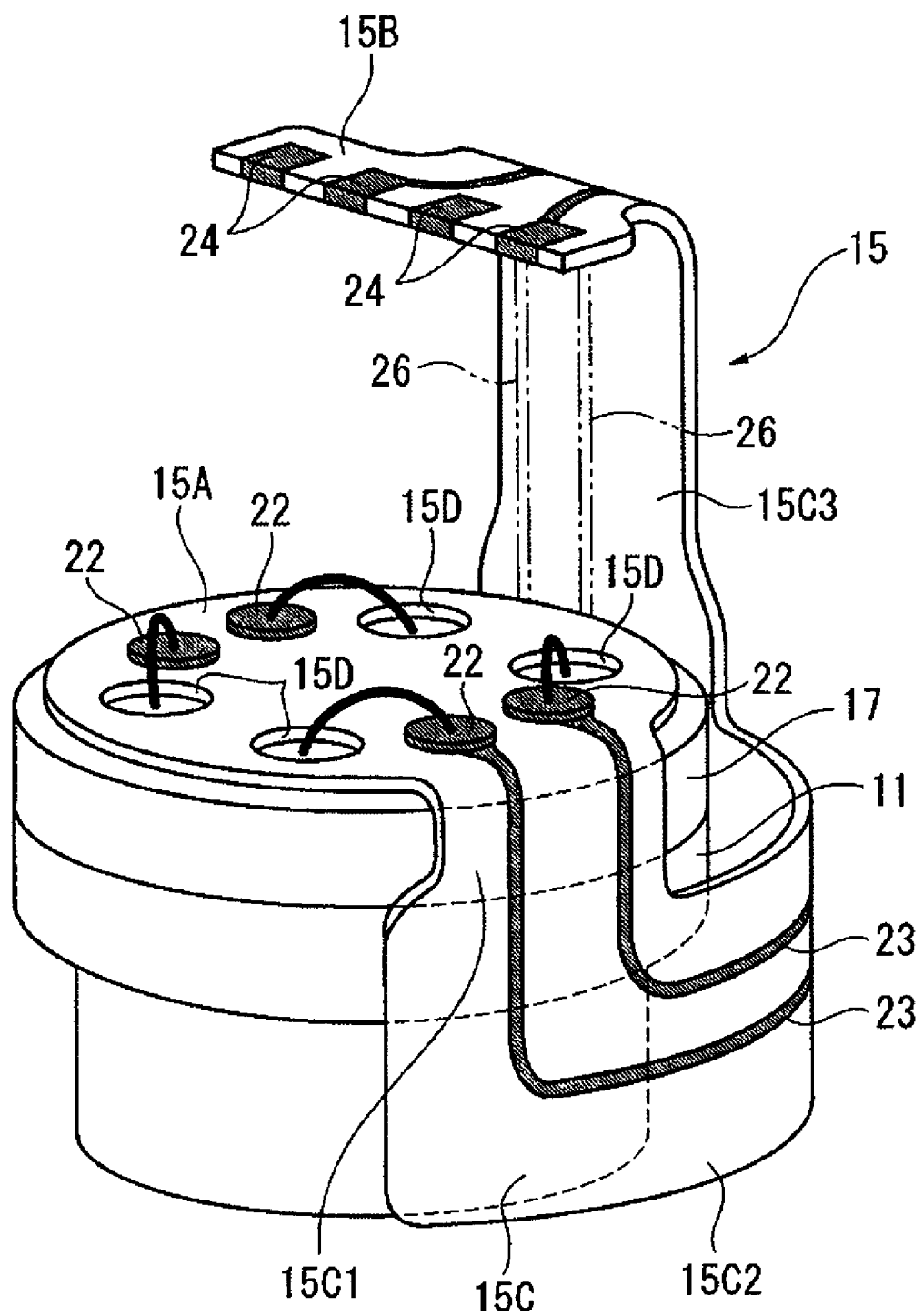
FIG. 2 is a perspective view showing a flexible board attached to a sensor element.
Figure 3:
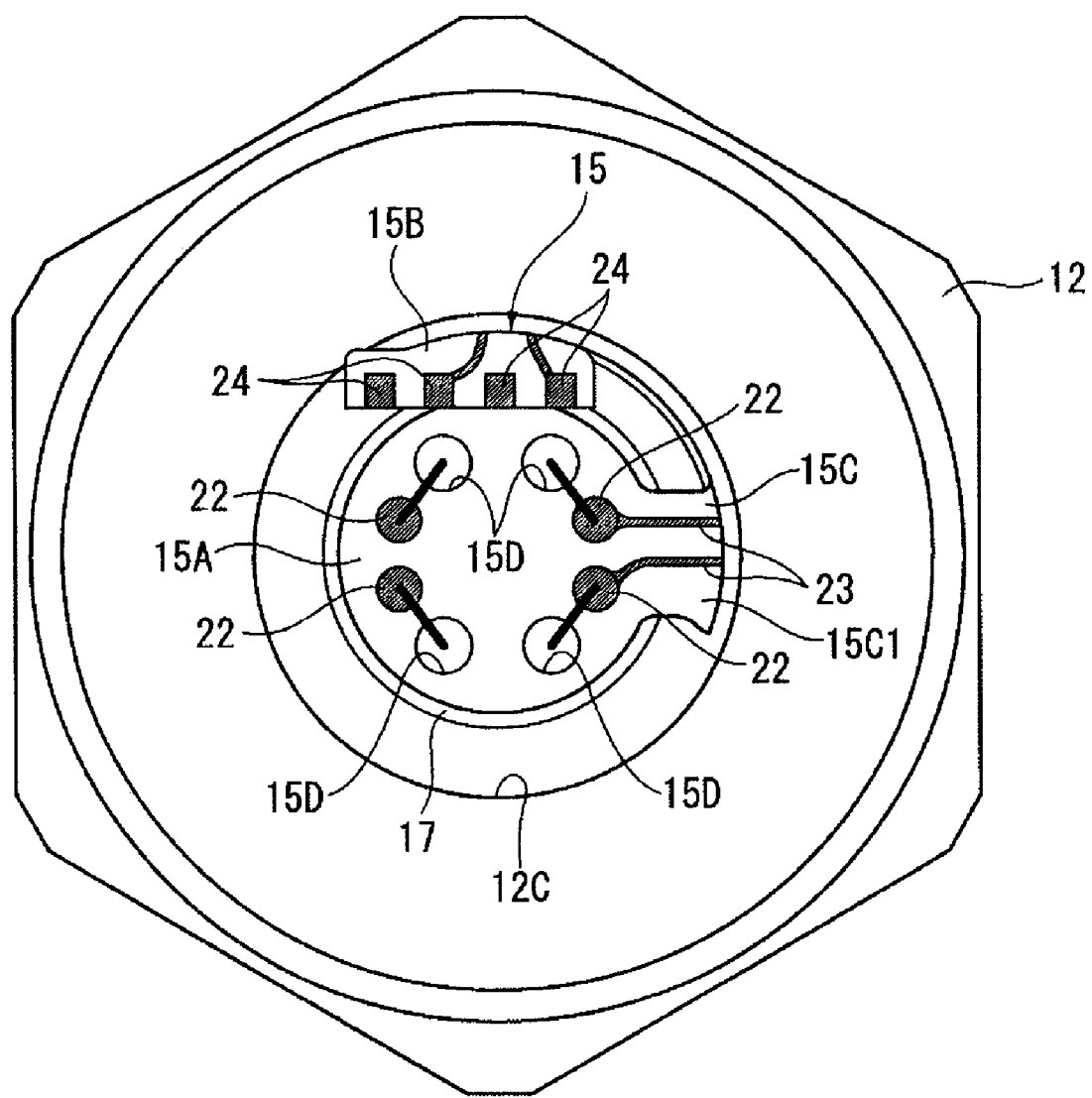
FIG. 3 is a plan view showing the flexible board attached to the sensor element.

FIGS. 2 and 3 show the flexible board 15 attached to the diaphragm 11. FIG. 2 is a perspective view showing the flexible board 15 attached to the diaphragm 11. FIG. 3 is a plan view showing the flexible board 15 attached to the diaphragm 11.

As shown in FIGS. 2 and 3, the first end 15A of the flexible board 15 is formed in a disk having a slightly smaller diameter than that of the disk 11B of the diaphragm 11. A plurality (four in the figures) of thin disk bonding pads 22 are circumferentially arrayed on the top side of the first end 15A. The bonding pads 22 protrude from the top side of the first end 15A.

A plurality (four in the figures) of holes 15D are provided between the bonding pads. The holes 15D are provided for wire bonding between the bonding pads 22 and the diaphragm 11.

Figure 4:
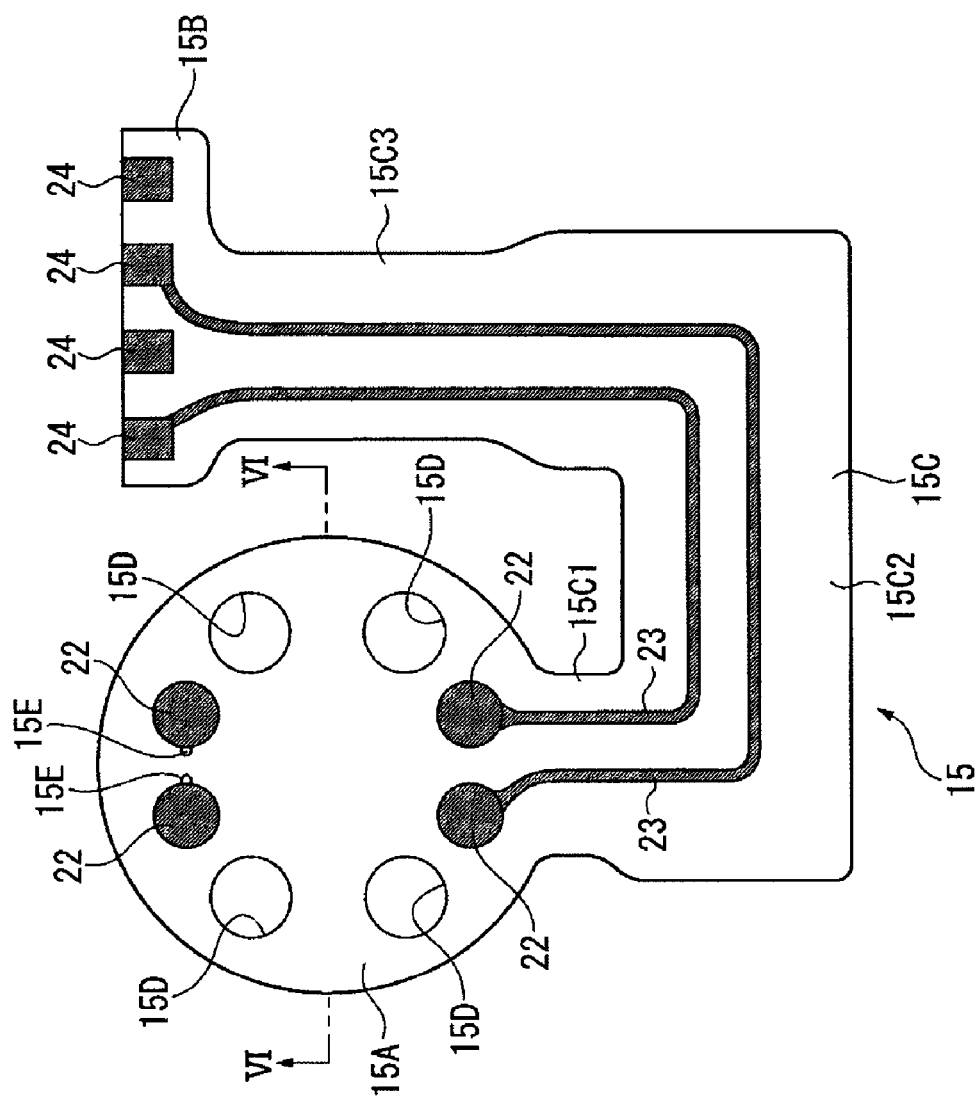
FIG. 4 is an expansion plan of a top side of the flexible board.
Figure 5:
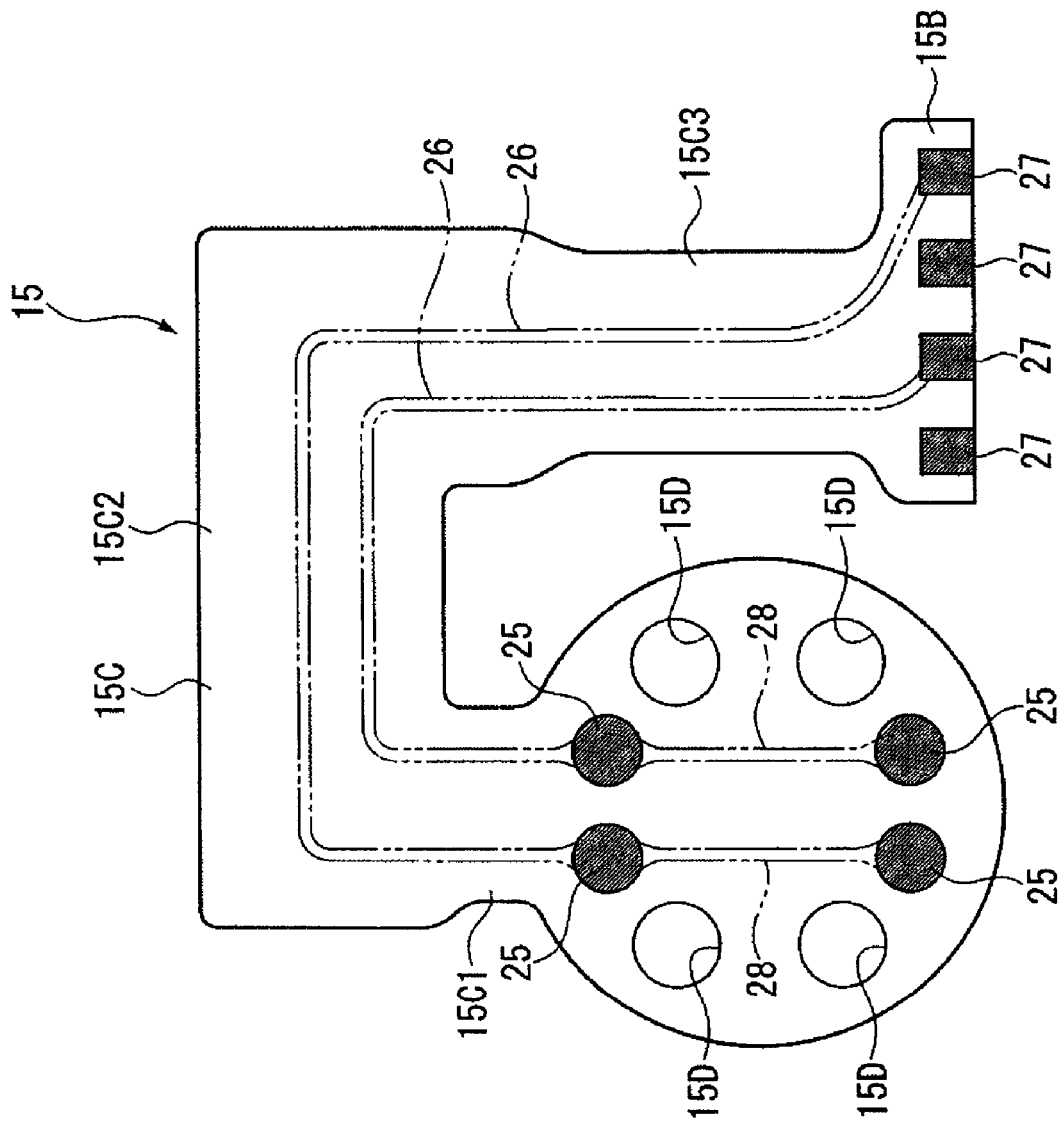
FIG. 5 is an expansion plan of a backside of the flexible board.
Figure 6:
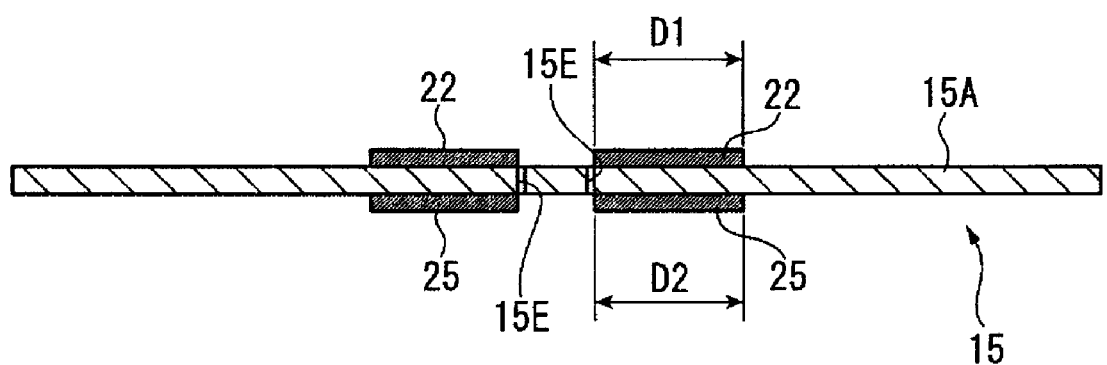
FIG. 6 is a cross section taken along VI-VI line in FIG. 4.

FIG. 4 is an expansion plan view showing the top side of the flexible board 15. FIG. 5 is another expansion plan view showing the backside of the flexible board 15. FIG. 6 is a cross section taken along VI-VI line in FIG. 4.

As shown in FIG. 4, the belt portion 15C is a C-shaped member viewed in a plan, which includes a short section 15C1 connected to the first end 15A, a connector portion 15C2 connected at a right angle to the short section 15C1 and a long section 15C3 connected to the connector portion 15C2 at a right angle. The long section 15C3 is connected with the second end 15B. The width of the second end 15B is greater than the width of the long section 15C3.

Among the plurality of bonding pads 22, two of the bonding pads 22 disposed near the belt portion 15C are respectively connected with ends of two electro-conductive portions 23. The electro-conductive portions 23 are formed in a C-shape along the planar shape of the belt portion 15C. The other ends of the electro-conductive portions 23 are connected to a part of a plurality (four in the figure) of terminals 24 provided on the second end 15B. In the present embodiment, the bonding pads 22, the electro-conductive portions 23 and the terminals 24 provide a wiring pattern on the top side of the flexible board 15. The wiring pattern is mainly provided by copper.

As shown in FIG. 5, another wiring pattern corresponding to that on the top side is provided on the backside of the flexible board 15. Specifically, support pads 25 having the same shape as the bonding pads 22 are provided on the backside of the first end 15A of the flexible board 15 at positions corresponding to the bonding pads 22.

In the exemplary embodiment, among the plurality of support pads 25, two of the support pads 25 disposed near the belt portion 15C are respectively connected with ends of two electro-conductive portions 26 as shown in imaginary lines. The electro-conductive portions 26 are formed in a C-shape at a position corresponding to the electro-conductive portion 23. The other ends of the electro-conductive portions 26 are connected to a part of a plurality (four in the figure) of terminals 27 provided on the second end 15B. Adjoining support pads 25 may be connected by an electro-conductive portion 28.

In the exemplary embodiment, the support pads 25, the electro-conductive portions 26, 28 and the terminals 27 provide a wiring pattern on the backside of the flexible board 15. The wiring pattern is mainly provided by copper.

As shown in FIG. 6, the support pad 25 provided on the backside of the flexible board 15 protrudes from the backside of the first end 15A to be formed in a thin disk. All of the support pads 25 have the same thickness.

Axial centers of the bonding pads 22 and the support pads 25 substantially coincide with each other. The diameter D2 of the support pad 25 is the same as or larger than the diameter D1 of the bonding pad 22. In other words, the planar area of the support pad 25 is the same as or larger than the planar area of the bonding pad 22.

A through-hole 15E penetrates through the first end 15A of the flexible board 15 in order to electrically couple the bonding pad 22 and the support pad 25.

As shown in FIGS. 2 and 3, a short section 15C1 of the belt portion 15C is bent at an angle of ninety degrees or more relative to the first end 15A of the flexible board 15 in a direction to go away from the circuit board 14. The connector portion 15C2 integrated with the short section 15C1 is disposed in a curved manner along the outer circumference of the diaphragm 11 so that periphery of the connector portion 15C2 on the side of the circuit board 14 does not protrude from the top (flat) side of the cap 17. The long section 15C3 integrated with the connector portion 15C2 protrudes from the first end 15A toward the circuit board 14. The long section 15C3 and the second end 15B are bent at an angle of ninety degrees or more.

Figure 7:
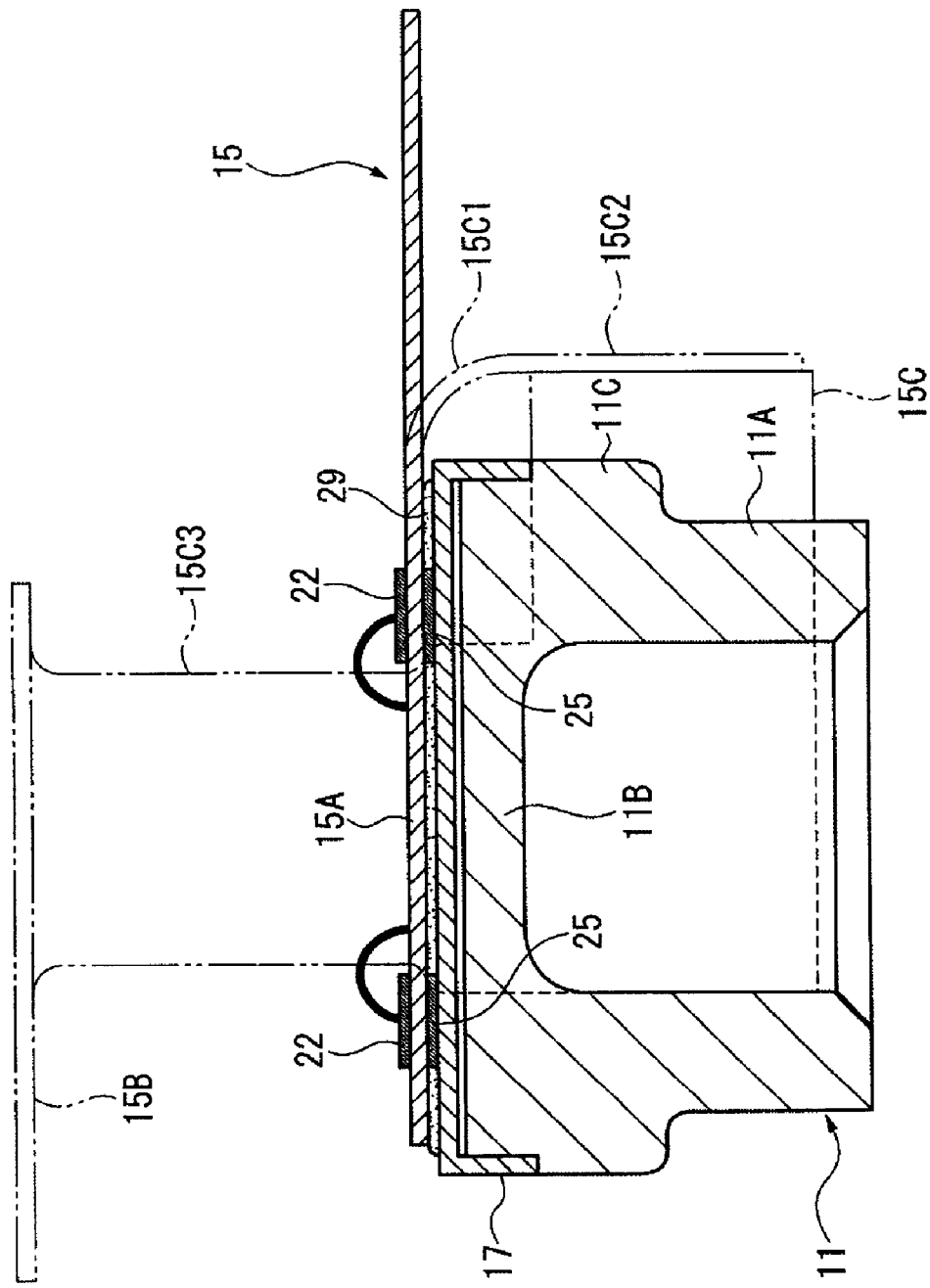
FIG. 7 is an illustration showing how the flexible board is bonded to a cap.

Next, how the pressure sensor 1 according to the exemplary embodiment is assembled will be described with reference to FIGS. 1 and 7. FIG. 7 is an illustration showing how the flexible board is bonded to the cap.

Initially, the diaphragm 11 is airtightly connected to the joint 10 by electron beam welding.

Subsequently, the first end 15A of the flexible board 15 and the cap 17 are thermocompression-bonded by an adhesion sheet 29 (see FIG. 7). During the thermocompression bonding, a force for pressing the first end 15A toward the cap 17 is applied. However, since the support pad 25 is provided at the same position as the bonding pad 22 in the exemplary embodiment, the first end 15A and the bonding pad 22 are not tilted relative to the top side of the cap 17. Then, the cap 17 is laser-welded to the diaphragm 11.

The diaphragm 11 and the bonding pad 22 provided on the first end 15A of the flexible board 15 are connected by wire bonding using a gold wire.

The bonding process is conducted by feeding a bonding line from a capillary tube (not shown) to the bonding pad 22. At this time, since the bonding pad 22 is not tilted, bonding operation can be stabilized.

Then, the block 12 and the joint 10 are airtightly connected by laser-welding. At this time, as shown in imaginary lines in FIG. 7, the short section 15C1 of the belt portion 15C is bent nearly by ninety degrees relative to the first end 15A of the flexible board 15 and the connector portion 15C2 is curved along the circumference of the diaphragm 11. In this condition, a distal end of the long section 15C3 protrudes relative to the first end 15A.

Subsequently, the circuit board 14 is fixed on an end surface of the block 12 and the second end 15B of the flexible board 15 is soldered onto the circuit board 14. During the soldering process, the second end 15B of the flexible board 15 is bent nearly by ninety degrees relative to the long section 15C3.

The flexible board 15 and the inner circumference of the block 12 are bonded and fixed. After the case 21 is fixed onto the joint 10 by projection-welding, the case 21 and the terminal 16 are crimped. Incidentally, the block 12 and the exterior portion 12D are provided as separate bodies, which are welded after crimping the case 21 and the terminal 16.

Then, the terminal 16 and the circuit board 14 are connected by precision resistance welding, the housing 13 assembled with the O ring 18 is inserted and the housing 13 is crimped to the block 12.

According to the exemplary embodiment, following advantages can be obtained.

(1) In a pressure sensor provided with the cap 17 on the measuring portion of the diaphragm 11 to which the first end 15A of the flexible board 15 is connected while the second end 15B of the flexible board 15 is connected to the circuit board 14 spaced away from the diaphragm 11, the flexible board 15 is provided with the first end 15A, the belt portion 15C that is bent at an angle of ninety degrees or more relative to the first end 15A in a direction to be away from the circuit board 14 and is curved along the outer circumference of the diaphragm 11, and the second end 15B that is bent at an angle of ninety degrees or more relative to the belt portion 15C to be connected to the circuit board 14. Accordingly, since it is only necessary that the first end 15A and the second end 15B are respectively bent at an angle of ninety degrees or more relative to the belt portion 15C, the flexible board 15 is not locally bent at an acute angle, thereby preventing generation of crack on the electro-conductive portion 23 of the wiring pattern provided on the flexible board 15. Further, since the belt portion 15C of the flexible board 15 is bent along the outer circumference of the diaphragm 11, the flexible board 15 can be accommodated within a compact space.

(2) Since the belt portion 15C is arranged so that the periphery thereof does not protrude from the top side of the cap 17, the belt portion 15C does not impede the bonding process of the second end 15B to the circuit board 14, so that the bonding process of the flexible board 15 can be easily conducted.

(3) The diaphragm 11 is bonded to the joint 10, the block 12 that provides a gap against the outer circumference of the diaphragm 11 is bonded to the joint 10 and the circuit board 14 is attached to the block 12. Accordingly, the diaphragm 11 is accommodated within the interior space of the block 12, thereby further enhancing space reduction.

(4) The bonding pads 22 connected with the wiring pattern are provided on the first end 15A of the flexible board 15 on a side opposite to the cap 17, and the support pads 25 having the same shape as the bonding pads 22 are provided on a side facing the cap 17 of the first end 15A at a position corresponding to the bonding pads 22. Accordingly, when the first end 15A of the flexible board 15 is compression-bonded to the cap 17, the first end 15A is not inclined or deformed irrespective of the pressing force applied on the bonding pad 22 toward the cap 17, thereby keeping the flatness of the bonding pad 22. Accordingly, since the wire-bonding between the bonding pad 22 and the diaphragm 11 can be securely conducted, strong bonding force can be obtained.

In this regard, the conventional example disclosed in JP-A-61-6848 employs an arrangement in which a plurality of terminal leads are provided on one side of the flexible board and linear backside pattern is provided on the other side. However, since the backside pattern and the terminal leads of the conventional arrangement do not correspond with each other, the flexible board may be deformed by the force applied onto the terminal lead. In order to solve the above problem, the pressure sensor 1 according to the exemplary embodiment that includes the diaphragm 11 having a measuring portion and the flexible board 15 having the first end 15A connected with the diaphragm 11 is provided with the bonding pads 22 on the first end of the flexible board 15 that form a part of the wiring pattern and the support pads 25 having the same shape as the bonding pads 22 on the opposite side of the first end 15A of the flexible board 15 at a position corresponding to the bonding pads 22.

(5) By providing a larger planar area on the support pad 25 than the planar area of the bonding pad 22, even when the positional relationship between the bonding pad 22 and the support pad 25 is somewhat out of alignment, the flatness of the bonding pad 22 can be secured, so that wire-bonding can be stably conducted and the flexible board can be easily manufactured.

(6) The wiring pattern is formed on a side of the flexible board 15 facing the cap 17 and a part of the wiring pattern is provided by the support pad 25, so that the support pad 25 can be formed simultaneously with the formation of the wiring pattern by providing the support pad 25 as a part of the wiring pattern formed in advance. Accordingly, the flexible board 15 provided with the support pad 25 can be easily manufactured.

(7) Since the linear electro-conductive portion 28 is provided for connecting the adjoining support pads 25, as compared with an arrangement in which the electro-conductive portion for electrically coupling the belt portion 15C with the remotely-disposed support pad 25 is formed detouring around the hole 15D, the flexible board 15 can be easily manufactured with smaller size.

(8) The air-vent filter 19 provided on the housing 13 allows communication between the inside of the sensor and the external air even when the inside of the housing 13 is sealed, thereby providing adaptation for the change in the external environment.

(9) Since the air-vent filter 19 is provided on the distal end 13B of the housing 13 at a position covered by the connector, water, oil and the like do not directly adhere to the air-vent filter 19, thereby preventing the air-vent filter 19 from being clogged.

(10) Since a part of the flexible board 15 is fixed on the interior wall of the block 12, the flexible board 15 is not vibrated even when the sensor itself is vibrated while, for instance, transporting the sensor 1, thereby preventing the wiring pattern from being damaged.

Incidentally, the scope of the present invention is not limited to what is disclosed in the above exemplary embodiment, but modifications, improvements and the like are within the scope of the present invention as long as an object of the present invention can be achieved.

For instance, though the periphery of the belt portion 15C does not protrude from the top side of the cap 17 in the exemplary embodiment, the periphery of the belt portion 15C of the invention may be protruded from the top side of the cap 17.

Further, the external shape of the block 12 is not limited to hexagon, but may be formed in a cylindrical shape.

The invention is not applied limitatively to the pressure sensor, but may be applied to a differential-pressure sensor, temperature sensor and the like.

What is claimed is:

1. A sensor, comprising:
   a sensor element having a measuring portion;
   a cap provided on the measuring portion of the sensor element; and
   a flexible board, wherein
   the flexible board has a first end connected to a flat side of the cap, a belt portion that is bent away from a circuit board spaced apart from the sensor element at an angle of ninety degrees or more relative to the first end and is curved along and spaced away from an outer circumference of the sensor element, and a second end that is bent at an angle of ninety degrees or more relative to the belt portion to be connected with the circuit board.

2. The sensor according to claim 1, wherein a periphery of the belt portion does not protrude from the flat side of the cap.

3. The sensor according to claim 1, wherein the sensor element is bonded to a joint,
   a block having an inner circumference spaced away from the outer circumference of the sensor element by a predetermined gap is bonded to the joint, and
   the circuit board is attached to the block.

4. The sensor according to claim 1, wherein a bonding pad that constitutes a part of a first wiring pattern is provided on the first end of the flexible board at a side remote from the cap, and
   a support pad having the same shape as the bonding pad is provided on the first end of the flexible board on a side facing the cap at a position corresponding to the bonding pad.

5. The sensor according to claim 4, wherein a planar area of the support pad is larger than a planar area of the bonding pad.

6. The sensor according to claim 4, wherein a second wiring pattern is provided on a side of the flexible board facing the cap, and
   a part of the second wiring pattern is constituted by the support pad.

7. A method for manufacturing a sensor, the method comprising the steps:
   providing:
   a sensor element having a measuring portion,
   a cap, and
   a flexible board having a first end, a belt portion, and a second end;
   attaching the cap on the sensor element;
   connecting the first end of the flexible board to the cap;
   bending the belt portion by an angle of ninety degrees or more relative to the first end to be curved along and spaced away from an outer circumference of the sensor element; and
   bonding the second end to a circuit board.

* * * * *